(12) United States Patent
Thöne et al.

(10) Patent No.: US 12,260,776 B2
(45) Date of Patent: Mar. 25, 2025

(54) METHODS AND DEVICES FOR SIMULATING ELECTROMAGNETIC BEAMS

(71) Applicant: ANSYS, Inc., Canonsburg, PA (US)

(72) Inventors: Stefan Thöne, Pforzheim (DE); Eugen Meier, Ditzingen (DE); Bernd Büttner, Gera (DE)

(73) Assignee: ANSYS, INC., Canonsburg, PA (US)

( * ) Notice: Subject to any disclaimer, the term of this patent is extended or adjusted under 35 U.S.C. 154(b) by 524 days.

(21) Appl. No.: 17/152,081

(22) Filed: Jan. 19, 2021

(65) Prior Publication Data

US 2022/0068162 A1    Mar. 3, 2022

(30) Foreign Application Priority Data

Sep. 3, 2020 (DE) ..................... 10 2020 122 990.9

(51) Int. Cl.
*G09B 23/22* (2006.01)
*G06F 30/20* (2020.01)

(52) U.S. Cl.
CPC ............. *G09B 23/22* (2013.01); *G06F 30/20* (2020.01)

(58) Field of Classification Search
CPC ............................... G06F 30/20; G09B 23/22
See application file for complete search history.

(56) References Cited

U.S. PATENT DOCUMENTS

| | | | |
|---|---|---|---|
| 2011/0218789 A1* | 9/2011 | Van Beurden | G03F 7/705 702/57 |
| 2014/0222380 A1* | 8/2014 | Kuznetsov | G01B 21/30 702/189 |
| 2018/0129131 A1 | 5/2018 | Schmidt et al. | |
| 2020/0249153 A1* | 8/2020 | Pourkazemi | G01N 22/02 |

FOREIGN PATENT DOCUMENTS

| | | |
|---|---|---|
| DE | 2005-036892 A1 | 2/2007 |
| DE | 2016-013260 A1 | 5/2018 |

OTHER PUBLICATIONS

Imperator et al. Transmission Through Layered Media With Rough Boundaries: First-Order Perturbative Solution IEEE Transactions on Antennas And Propagation, vol. 57, No. 5, May 2009 (Year: 2009).*
Yang et al. Bidirectional Reflection of Semitransparent Polytetraroethylene (PTFE) Sheets On A Silver Film International Journal of Heat and Mass Transfer, revision Oct. 11, 2019 (Year: 2019).*
Richard Fitzpatrick Reflection At A Dielectric Boundary Feb. 2, 2006 (Year: 2006).*

* cited by examiner

*Primary Examiner* — Rehana Perveen
*Assistant Examiner* — Cuong V Luu
(74) *Attorney, Agent, or Firm* — WOMBLE BOND DICKINSON (US) LLP

(57) ABSTRACT

A method for the simulation of a propagation of electromagnetic beams, in particular light beams, is revealed, comprising the following steps of parametric specification of a first beam relative to a first boundary layer, specification of a first material into which the first beam should propagate after the first boundary layer, and determination of a reflection and/or transmission of the first beam relative to the first boundary layer on the basis of the first material and on the basis of a first model, wherein the first model comprises one or more functions which associate one or more reflection and/or transmission parameters with the first beam, and wherein the reflection and/or transmission parameter(s) associated with the first beam via the functions are determined.

20 Claims, 6 Drawing Sheets

METHODS AND DEVICES FOR SIMULATING ELECTROMAGNETIC BEAMS

CROSS-REFERENCE TO RELATED APPLICATIONS

This application claims benefits of a German Patent Application Ser. No. 10 2020 122 990.9 entitled "Verfahren und Vorrichtungen zur Simulation elektromagnetischer Strahlen", filed Sep. 3, 2020. The contents of which are hereby incorporated by reference in its entirety for all purposes.

BACKGROUND

When simulating electromagnetic beams, e.g. light beams propagating through materials such as fog, a physically accurate calculation of the propagation of a beam cannot be performed in real time. This is because complex calculations must be performed to take into account reflection and diffusion effects as the beam enters the material and passes through it. The calculation could be based on a look-up table that takes into account all possible angles of a light beam at an entrance surface and an exit surface of the material as well as different material thicknesses. But this look-up table would require large amounts of memory and would therefore not be suitable for every implementation. Improvements in this area are desirable.

TECHNICAL FIELD

The present disclosure relates to methods and devices for the simulation of one or more electromagnetic beams.

SUMMARY OF THE DESCRIPTION

One aspect of this disclosure involves a method for the simulation of a propagation of electromagnetic beams, such as light beams, comprising the steps of providing a first beam relative to a first boundary layer, providing a first material into which the first beam should propagate after the first boundary layer, and determining a reflection and/or transmission of the first beam relative to the first boundary layer on the basis of the first material and on the basis of a first model. The first model comprises one or more functions which associate one or more reflection and/or transmission parameters with the first beam. The reflection and/or transmission parameter(s) are determined to be associated with the first beam via the functions.

Another aspect of this disclosure relates to a method, comprising the steps of providing a first data set comprising information about a light beam relative to a first boundary layer and about reflections and transmissions of this beam at the first boundary layer when entering a given material, and generating a first model based on the first data set, wherein the first model comprises one or more functions, each of which assigning one or more reflection and/or transmission parameters to one or more parameters of the beam.

A further aspect of this disclosure relates to a method for simulation of a propagation of electromagnetic beams, such as light beams, comprising the steps of providing a representation of a first beam transmitting via a starting material towards a first boundary layer, the first boundary layer corresponding to a transition location between the starting material and a first material, invoking a first model to assign one or more reflection and/or transmission parameters for the first beam incident on the first boundary layer based on the first material and determining a reflection and/or a transmission of the first beam incident on the first boundary layer based on the reflection and/or transmission parameters for the first beam.

A further aspect of this disclosure relates to a method for creating a model for a simulation of an electromagnetic beam, such as a light beam, comprising the steps of providing a first data set comprising information about a beam relative to a first boundary layer and about reflections and/or transmissions of this beam at the first boundary layer upon entry into a given material, the beam associated with one or more parameters, and calculating a first model based on the first data set, wherein the first model comprises one or more functions to assign the one or more reflection and/or transmission parameters based on the one or more parameters of the beam.

The aspects and embodiments described herein can include non-transitory machine readable media that can store executable computer program instructions that when executed cause one or more data processing systems to perform the methods described herein when the computer program instructions are executed. The instructions can be stored in non-transitory machine readable media such as in dynamic random access memory (DRAM) which is volatile memory or in nonvolatile memory, such as flash memory or other forms of memory. The aspects and embodiments described herein can also be in the form of data processing systems that are built or programmed to perform these methods. For example, a data processing system can be built with hardware logic to perform these methods or can be programmed with a computer program to perform these methods.

The above summary does not include an exhaustive list of all embodiments are aspects in this disclosure. All systems, media, and methods can be practiced from all suitable combinations of the various aspects and embodiments summarized above and also those disclosed in the detailed description below.

BRIEF DESCRIPTION OF THE DRAWINGS

The present invention is illustrated by way of example and not limitation in the figures of the accompanying drawings in which like references indicate similar elements. The figures do not always show the embodiments or the features of the embodiments to scale. The dimensions and/or values of the various features may be enlarged or reduced accordingly, particularly for the sake of clarity of description.

DETAILED DESCRIPTION

Figure 1:
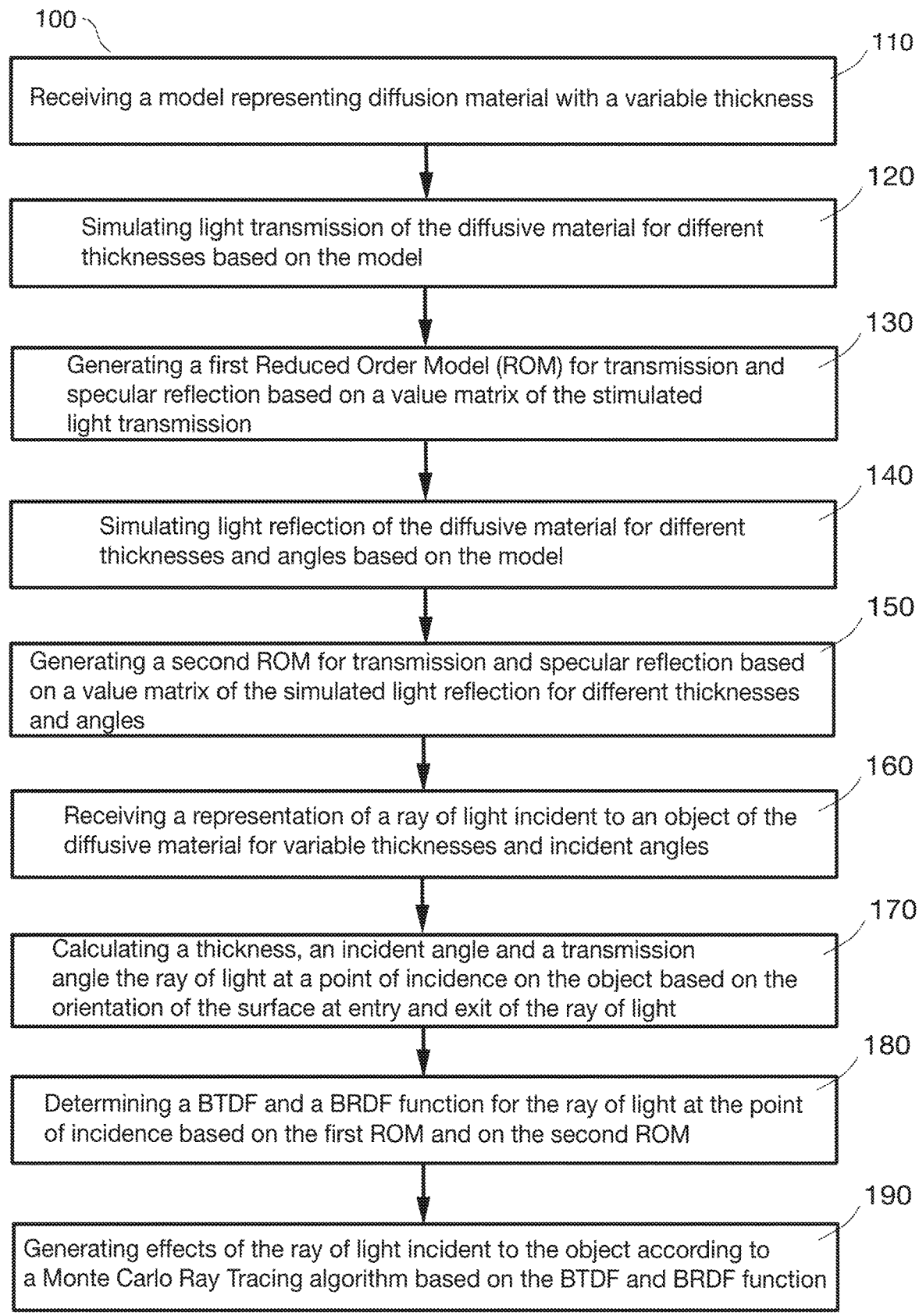
FIG. 1 shows a flow chart of a method according to an embodiment of disclosure.

The disclosure describes techniques (e.g. methods, systems or devices etc.) which can improve a simulation of one or more electromagnetic beams.

This problem is solved by the disclosed techniques, which are defined by the subject matters of the independent claims. The dependent claims relate to corresponding embodiments. In the following, different aspects and embodiments of these aspects are disclosed, which provide additional features and advantages.

Some embodiments solve the special problem of simulating the reflection and transmission of a light beam in real time. Possible reflections and possible transmission of incident light beams at an entrance boundary layer are modeled by assigning a light beam intensity to selected angles of incidence and/or material thicknesses of a light beam in advance. This assignment represents a first order reduced model. For light beams propagating through and exiting the material a second order reduced model is generated analogously. Based on the two reduced-order models, transport equations (e.g. the Maxwell equations) of a light beam can be solved computationally efficient, such that a simulation of light beams in real time is possible.

A first aspect relates to a method for the simulation of a propagation of electromagnetic beams, in particular light beams, comprising the steps
Providing a first beam relative to a first boundary layer;
Providing a first material into which the first beam should propagate after the first boundary layer
Determining a reflection and/or transmission of the first beam relative to the first boundary layer on the basis of the first material and on the basis of a first model, wherein the first model comprises one or more functions which associate one or more reflection and/or transmission parameters with the first beam, and wherein the reflection and/or transmission parameter(s) are determined which are associated with the first beam via the functions. The providing of a beam and/or a material can be based in particular on beam properties and/or environmental properties. These can be defined in particular by corresponding parameters.

Reflection is a physical process in which electromagnetic beams are deflected and reflected either at a boundary layer between two materials (surface reflection) or inside a material (volume scattering), transmission being the passage of electromagnetic beams through a medium (i.e. a material).

A boundary layer can be a surface between two materials. A boundary layer can be a surface of a material. A boundary layer can be a defined surface which can separate two materials defined by different reflection and/or transmission parameters. For example, a boundary layer can define a boundary between air and fog (even if this is not exact in reality because of the gradual transition from air to fog). A boundary layer can also separate two different objects.

Both processes can be accompanied by diffusion (also called scattering), in which a light beam with a certain direction of propagation is deflected in different directions. This can also be termed diffuse reflection and diffuse transmission. If diffusion does not occur, the result is that a light beam with a certain direction of propagation is deflected into a light beam with a certain direction during reflection or transmission, according to the laws of geometrical optics.

One or more parameters of a beam may include in particular an angle of incidence and/or a beam intensity. In addition or alternatively, a parameter may relate to a property of the electromagnetic wave, for example a polarization direction. In particular, a parameter may relate to a horizontal polarization and/or a vertical polarization and/or an angle of polarization. In particular, an angle of incidence and angle of polarization can be defined relative to a boundary layer. Additionally or alternatively, a parameter can relate to a beam quality. For example, a parameter can contain the information whether a beam has a particle property and/or a wave property.

In the sense of this disclosure, an angle of incidence can be defined as an angle at which a beam in the form of electromagnetic beams, e.g. particle beams and/or energy waves, strikes a defined obstacle. The angle of incidence can be defined differently. In particular, the angle of incidence can be defined between a beam and a horizon. If a beam passes through an optical boundary layer, its angle of incidence can be the angle of incidence to the perpendicular on this surface. An angle of incidence can be defined in a similar way. If a material into which the beam is incident is optically denser, for example a beam that is incident from air to glass, the angle of incidence is smaller than the angle of reflection. The beam is thus refracted towards the perpendicular. If the second medium is optically thinner, e.g. a beam passing from glass to air, the angle of reflection is larger than the angle of incidence and the beam is refracted away from the perpendicular. The refractive index n is the sine ratio of these two angles and is also known as Snellius' law of refraction. In addition or alternatively, the angle of incidence can also refer to the angle between the direction of incidence of a beam and a perpendicular to a surface of a material into which the beam is incident.

A material can include any medium that a beam can pass through at least partially. A material can be a non-solid medium, for example a gas, but also a vacuum. A material can be a liquid or a solid material, for example glass. A material can also be a mist or a vapor. This will be explained in more detail later. In particular, a material can have one or more reflection parameters and/or transmission parameters. A material can differ from another material in particular in the respective reflection and/or transmission parameters.

In particular, a function can include a look-up table. Additionally or alternatively, a function can include a parametric function. A parametric function can in particular relate to an analytical function. Additionally or alternatively, a parametric function can be a statistical function. This will be explained in detail later. By the functions of the model a physically exact model can be approximated and/or mapped at preselected sections. This can be advantageous to reduce computing resources, e.g. computing power and/or memory capacity, which are necessary to execute the method.

A function can be a unique mapping of one or more parameters to a reflection parameter and/or a transmission parameter. A unique mapping can be injective, surjective and/or bijective. Additionally or alternatively, a function can be an ambiguous mapping of one or more parameters. For example, an angle of incidence of a light beam can be mapped to an angle of reflection of a reflected light beam and to an angle of reflection of a transmitted light beam.

An embodiment of the first aspect relates to a method, comprising the step:
Parametric specification of a second beam relative to the first and/or a second boundary layer of the material;

Determining a reflection and/or transmission of the second beam relative to the first boundary layer and/or the second boundary layer and on the basis of a second model, wherein the second model comprises one or more functions, each of which assigns one or more second reflection and/or transmission parameters to one or more parameters of the second beam, and wherein those reflection and/or transmission parameters are determined which are assigned to the second beam via the one or more functions.

A second beam may in particular relate to a continuation of the first beam, which propagates in the first material and/or exits from the first material at the second boundary layer. Reflections and transmissions can occur both in the material and/or when the beam moves through the material. At the second boundary layer, the second beam can in particular enter a second material. When passing through the material and/or at the second boundary layer, reflections and transmissions of the second beam are possible. These are determined on the basis of a second model. The functions of the second model can have the same structures and requirements as the functions of the first model. They can relate to injective, surjective and/or bijective unambiguities and/or include ambiguities. Further features will be explained later.

An embodiment of the first aspect relates to a method, wherein the providing of the first and/or second material comprises a providing of a material thickness of the first material and/or the second material; and wherein the determination of the reflection and/or transmission parameters is based on the material thickness of the first material and/or the second material.

The thickness of the material can be determined by the distance a beam travels in the material. This distance can also be referred to as free path length. In addition or alternatively, the material thickness can relate to a distance between two boundary layers, by which the material is limited to other materials and/or material sections. This means that the material thickness does not have to be determined by the shortest or the largest distance between two boundary layers of the material. However, such a definition of the material thickness is also possible.

An embodiment of the first aspect relates to a method wherein the first and second boundary layers are inclined to each other.

By using two order-reduced models to determine the reflection and/or transmission parameters at and/or between two boundary layers of a material, which are not plane-parallel, an efficient and effective simulation of a corresponding beams propagation is possible.

An embodiment of the first aspect relates to a method where the material is determined by:

an absorption coefficient;
a diffusion coefficient;
a phase function; or—a refractive index.

A material can be solid, liquid and/or gaseous. Additionally or alternatively, a material can cause a reflection and/or transmission of a beam depending on a wavelength of the beam. Reflection and/or transmission properties of a material can be described mathematically for example by Beer-Lambert's law, Snellius' law of refraction and/or Fresnel's formulas.

The absorption coefficient, also known as the damping constant or attenuation coefficient, is a measure of the reduction in an intensity of electromagnetic beams when passing through a material. In particular, the dimension of the absorption coefficient can be 1/length, for example 1/cm. Alternatively, an absorption coefficient can also indicate a probability that a beam will be absorbed along a given path and in a given material. A large absorption coefficient can mean that the material strongly shields a beam, a small one can mean that the material is more transparent to the beam. The intensity decrease, which is quantified by an absorption coefficient, can be caused by dissipation processes in the material, which transform the beams energy into another form of energy, e.g. for heating the material. Additionally or alternatively, scattering processes that deflect the beams from its direction can contribute to the intensity decrease. The absorption coefficient can be a parameter of Beer-Lambert's law.

The diffusion coefficient is a measure for the fraction of a beam that is scattered along a given path. In particular, it can define a probability that a light beam will pass undisturbed through a material. The unit of the diffusion coefficient can be 1/length, for example 1/mm. The diffusion coefficient can be part of a model or function based on Beer-Lambert's law.

The phase function specifies a probability that a beam, in particular a particle of a beam, is scattered in a certain direction at a boundary layer. A simplified phase function can also be considered as a phase function, for example a Henyey-Greenstein phase function.

The refractive index can be defined as the ratio of the wavelength of a beam in vacuum to the wavelength in the material. When two materials meet at a boundary layer through which a beam is refracted, the material with the higher refractive index can be defined as an optically denser material. A refractive index can be a parameter in Snellius' law of refraction. The parameters mentioned above are used, for example, to describe material properties in the context of the so-called transport theory, which describes a transport of beams through a material and the balance of radiance (or beams intensity) at any point within the material.

Basically, all parameters for determining the material are possible which characterize a scattering of an electromagnetic beam at a scattering object, regardless of whether the material thickness of the scattering object is greater or smaller than one wavelength of the beam, in particular also refraction and polarization properties. The latter is in particular advantageous if scattering at scattering objects with orientation-dependent scattering properties is to be simulated.

An embodiment of the first aspect relates to a method, whereby the method is executed in real time.

Real-time execution of the method may include that certain results of the method, e.g. an angle and/or an intensity of a refracted beam, can be provided within a predetermined time period.

In particular or as an example, a real-time capability can be achieved by reducing one or more functions of a first, second and/or further model in a complexity to such an extent that they can be executed correspondingly fast on a corresponding hardware, for example a computer, microcontroller and/or FPGA, so that the respective specified real-time conditions are fulfilled.

Real time can be understood as the operation of a computing system to execute a method according to an embodiment of this disclosure in such a way that a processing result is available within a given time period. Data of the processing result can be provided temporally coincidental or according to a predetermined distribution and/or at predetermined times, depending on the use case.

It can be required that a real time is strictly adhered to. A hard real-time guarantees that a given computing time after which a processing result must be available is never exceeded. In an embodiment, the method can be configured in such a way that a real-time is strictly kept.

Alternatively, it can be required that a real-time is softly maintained. A soft real-time guarantees the provision of a processing result after a given computing time only statistically. This can be achieved, for example, by providing a processing result on average after a specified maximum computing time and/or that the actual provision times may only deviate from this average with a specified variance. In an embodiment, the method can be configured in such a way that real-time is softly maintained.

A fixed real time includes a hard real time where the processing result is always provided at a precisely defined time. No downward or upward variation of the delivery time is allowed. In an embodiment, the method can be configured to maintain a fixed real-time.

In particular, the method according to the first aspect can be executed in hard real time, soft real time and/or fixed real time. Advantageously, the computation of the first, the second or the further models can be defined with respect to a computation time and/or a provision time of a processing result, in particular in such a way that the method can be better integrated into a simulation environment.

An embodiment of the first aspect relates to a method, the method comprising further determinations of one or more reflections and/or transmissions of a beam based on one or more predetermined materials relative to one or more boundary layers.

For example, if a given first beam was simulated with respect to its reflections and transmissions at a first boundary layer when penetrating into a first material and with respect to its reflections and transmissions as a second beam before and/or at a second boundary layer of a first material, then this light beam can penetrate into another material. This can happen in particular immediately after leaving the first material. When penetrating the second material, reflections and/or transmissions of the beam relative to a first boundary layer of the second material are determined by a third model. This model is in principle constructed in the same way as the first and second model and includes in particular functions for the determination of the reflections and transmissions at the first boundary layer of the second material. At the exit of the beam from the second material, a fourth model allows the determination of reflections and transmissions before and/or at a second boundary layer of the second material, the exit boundary layer. This is advantageous for simulating electromagnetic beams when moving through an environment consisting of several different materials. This may relate to, for example, an environment for a driving simulation, where a driver should be presented with an environment as realistic as possible. Alternatively, this could be a simulation of the propagation of an electromagnetic wave in a multilayer optical fiber. The other models can also be dependent on a material thickness of the material for which they provide reflection and/or transmission functions. In another alternative, beams can be simulated which pass through layered and/or coated materials. In general, a simulation of composite and/or multi-material objects is possible by using a number of order reduced models.

An embodiment of the first aspect relates to a method, wherein at least one of the models has a parametric function.

A model of the method may in particular be the first model, the second model and/or any further model having a function for mapping one or more parameters of a beam to one or more reflection and/or transmission parameters of this beam. In particular, a parametric function can be a function of one or more parameters. In particular, the parameters can be the parameters described above (absorption coefficient, diffusion coefficient, phase function and/or refractive index) to describe reflection and transmission properties of a material. Furthermore, a parameter can be a path, in particular a penetration depth of a beam into a material. Additionally or alternatively a parameter can be a time. Additionally or alternatively, a parameter can be an index, e.g. a counting index, which contains information about the already irradiated boundary layers and/or materials. Advantageously, a plurality of assignments of one or more parameters of an input beam to one or more parameters of a reflected and/or transmitted beam can be performed by a function. For example, different possible input angles of a beam can be mapped to corresponding angles of the refracted beam by a single parametric function.

In addition to physical parameters, a function can also include parameters to adapt the function as a complexity reduced image of another more complex function. For example, a physically accurate function to describe a reflection and/or transmission can be approximated by a parametric function. The parameters can be for example weightings of polynomial coefficients or an offset. Thus physical parameters may only be contained indirectly and/or approximately in the function covered by the model.

In particular, a definition set can be specified for each function. A definition set comprises possible parameters and parameter values of an incident beam. It is advantageous to avoid the execution of the method and thus to save computation time, if input values are provided, which are not included in a definition set.

In particular, a set of images can be specified for each function. An image set comprises possible parameters and parameter values of a refracted and/or scattered beam. It is advantageous not to provide a result if one or more processing values are not included in a provided image set.

An embodiment of the first aspect relates to a method, wherein a function of the first model, the second model and/or a further model comprises a part of a power series, in particular a power series of an analytic function, and/or a statistical function.

An analytic function can be represented by an infinite, convergent power series, e.g. a Taylor series. In particular, an analytic function can be an exponential function or a trigonometric function. All non-analytic functions are also considered analytical functions, if they have a power series development in the range relevant for a processing result. It is advantageous to provide an order reduced function for a model, if only one or some series members of a power series of an analytical function, which represents a realistic description of a refractive and/or scattering process, are included by the function. Additionally or alternatively, such a function can also be approximated by an artificial intelligence algorithm, for example based on a neural network and/or a deep learning algorithm.

A statistical function in the sense of this disclosure can comprise one or more estimators, which estimate the reflection and/or transmission parameters of the refracted beam on the basis of the parameters of an incident beam, e.g. an angle of incidence. A result of a statistical function can include, for example, a probability of an output angle. In addition or alternatively, the result of a statistical function can include an average and/or expected value of an output angle and/or a beams intensity. Additionally or alternatively, a result of a statistical function can be a set, for example a set of possible exit angles, and/or a probability distribution of possible exit angles.

A second aspect relates to a method, comprising the following steps:
  Providing a first data set comprising information about a light beam relative to a first boundary layer and about reflections and transmissions of this beam at the first boundary layer when entering a given material;
  Generating a first model based on the first data set, wherein the first model comprises one or more functions, each of which assigns one or more reflection and/or transmission parameters to one or more parameters of the beam. In particular, the first data set can be based on a non-order reduced physical model, which describes reality as accurately as possible without taking into account computing capacities.

Additionally or alternatively a first data set can be created based on a measurement. Based on the first data set, different beams and their reflection and transmission at a boundary layer of a material can be specified parametrically. The given material can be characterized by different parameters as described in relation to the first aspect, in particular by a material thickness, which can also be defined as described above.

The functions of the model in particular approximate the data set and/or map it at selected sections.

In particular, different functions can be used for different materials, which describe the reflection and/or transmission behavior of a beam on a certain material or group of materials. The functions of a model can differ in the degree of a complexity reduction.

An embodiment of the second aspect relates to a method comprising the following steps:
  Providing a second data set comprising information about a beam relative to the first and/or a second boundary layer and about reflections and transmissions of this beam relative to the first and/or second boundary layer when passing through the given material;
  Generation of a second model based on the second data set, the second model comprising one or more functions, each of which assigns one or more reflection and/or transmission parameters to one or more parameters of the beam.

In particular, the second data set can be included by the first one or be equal to the first data set. The functions of the second model can have the same or similar structures and properties as the functions of the first model.

An embodiment of the second aspect relates to a method, with the step:—Determination of the first and/or the second data set based on a simulation of one or more incident beams with one or more different angles of incidence at a first boundary layer on the basis of a first physical model.

Additionally or alternatively, the first and/or the second data set can also be based on one or more measurements.

An embodiment of the second aspect relates to a method, where the first and/or the second data set contains information about reflection and transmission at different materials and/or different material thicknesses.

An embodiment of the second aspect relates to a method where a function of the first model, the second model and/or a further model comprises a part of a power series of an analytical function and/or a statistical function.

The possible characteristics and structures of one or more functions of the first, second or further models are described in connection with the first aspect and apply without restriction to all aspects of the present disclosure. In particular, the functions can serve to approximate the first and/or the second data set.

A third aspect relates to a device adapted to perform a method according to one of the previous aspects or according to one of the previous embodiments.

In particular, the method to be performed may be stored at least partially by a computer program. Additionally or alternatively, the method to be executed may be at least partially implemented and/or stored on the hardware of the device, for example on an FPGA.

In a further aspect a computer-implemented method for simulation of a propagation of electromagnetic beams, in particular light beams, comprises the steps:
  providing a representation of a first beam transmitting via a starting material towards a first boundary layer, the first boundary layer corresponding to a transition location between the starting material and a first material;
  Invoking a first model to assign one or more reflection and/or transmission parameters for the first beam incident on the first boundary layer based on the first material;
  determining a reflection and/or a transmission of the first beam incident on the first boundary layer based on the reflection and/or transmission parameters for the first beam.

In an embodiment of the preceding aspect, the method further comprises:
  providing a representation of a second beam transmitting via the first material from the first boundary layer towards a second boundary layer, the second boundary layer corresponding to a transition location between the first material and a second material;
  invoking a second model to assign one or more reflection and/or transmission parameters for the second beam from the first boundary layer towards the second boundary layer based on the first material;
  determining a reflection and/or a transmission of the second beam from the first boundary layer towards the second boundary layer based on the reflection and/or transmission parameters for the second beam.

In an embodiment of the preceding aspect the first material is associated with a material thickness and the reflection and/or the transmission of the second beam are determined based on the thickness of the first material.

In an embodiment of the preceding aspect the material thickness is determined by a free path length of the second beam in the first material.

In an embodiment of the preceding aspect the material is associated with the following, in particular wave-dependent, parameters:
  absorption coefficient;
  diffusion coefficient
  phase function; or
  refractive index.

In an embodiment of the preceding aspect the method is executed in real time.

In an embodiment of the preceding aspect the method comprises one or more further determinations of one or more reflections and/or transmissions of a beam based on one or more predetermined materials relative to one or more boundary layers.

In an embodiment of the preceding aspect at least one of the models comprises a parametric function.

In an embodiment of the preceding aspect a function of the first model, the second model and/or the one or more further determinations comprises a part of a power series of an analytical function and/or a statistical function.

According to a further aspect, method for creating a model for a simulation of an electromagnetic beam, in particular a light beam, comprises the following steps:

providing a first data set comprising information about a beam relative to a first boundary layer and about reflections and/or transmissions of this beam at the first boundary layer upon entry into a given material, the beam associated with one or more parameters;

calculating a first model based on the first data set, wherein the first model comprises one or more functions to assign the one or more reflection and/or transmission parameters based on the one or more parameters of the beam.

In an embodiment of the preceding aspect the method comprises the following steps:

providing a second data set comprising information about the beam relative to the first and/or a second boundary layer and about reflections and/or transmissions of the beam relative to the first and/or second boundary layer as it passes through the material;

calculating a second model based on the second data set, the second model comprising one or more functions to assign the reflection and/or transmission of the beam relative to the first and/or second boundary layer based on the information about the beam relative to the first and/or the second boundary layer.

In an embodiment of the preceding aspect the method comprises the step:—determining the first and/or the second data set based on a simulation of one or more incident beams with one or more different angles of incidence at a first boundary layer on the basis of a first and/or second physical model.

In an embodiment of the preceding aspect the first and/or the second data set comprises information on reflection and/or transmission at different materials and/or different material thicknesses.

In an embodiment of the preceding aspect a function of the first model and/or the second model comprises a part of a power series of an analytical function and/or a statistical function.

According to a further aspect a device for simulating of a propagation of electromagnetic beams and/or for creating a model for a simulation of an electromagnetic beam, in particular a light beam, the device being configured to perform a method according to one of the preceding claims.

In the following descriptions, identical reference signs refer to identical or at least functionally or structurally similar features.

In the following description, reference is made to the accompanying drawings, which form part of the disclosure and in which, for illustrative purposes, specific aspects are shown in which the present disclosure can be understood.

In general, a disclosure about a described method also applies to a corresponding device to perform or produce the method or to a corresponding system comprising one or more devices, and vice versa. For example, if a specific method step is described, a corresponding device may include a feature to perform the described method step, even if this feature is not explicitly described or represented. If, on the other hand, for example a special device is described on the basis of functional units and/or structural features, a corresponding method may include a step which executes the described functionality or with which a corresponding structure can be produced, even if such steps are not explicitly described or represented. Likewise, a system can be provided with corresponding device features or with features to execute a certain method step. Features of the various aspects and designs described before or after can be combined with each other, unless explicitly stated otherwise.

FIG. 1 shows a flowchart 100 of a method according to an embodiment of the invention. In a first step 110 a model of the diffusion behavior of a material is obtained. This model 100 comprises a material model, which was created on the basis of physical parameters. It includes the diffusion coefficient of the material, the absorption coefficient of the material and a description of the phase function. For example, the absorption coefficient and the diffusion coefficient are parameters of a Beer-Lambert model, which models the attenuation of the light beam when propagating in a medium. The phase function indicates how an incident light beam is scattered. This can be done in particular depending on the wavelength. Due to the complexity of the model, this simulation cannot be performed in real time.

In a second step 120, the transmission behavior of the light beam is described by the model for different material thicknesses. The result is a first data set for deriving a first order-reduced model (ROM).

In a third step 130 a first ROM is generated based on the data set. The first ROM serves to describe a reflection and a transmission of an incident light beam. The reflection is described by one or more functions, which describe a reflection intensity of the light beam via an angle of incidence of the light beam relative to the entrance boundary layer of the material. In particular, this function can distinguish between horizontal polarization of the light beam and vertical polarization of the light beam, so that both reflection intensities are mapped over the angle of incidence. The transmission is mapped analogously by a second function in the first ROM. The first ROM can have functions for different material thicknesses and different orientations of the entrance boundary layer.

In a fourth step 140 reflection and transmission parameters are determined for different angles of incidence and material thicknesses to describe the propagation of the light beam in the given material. In this simulation, both the angle of incidence of the light beam and/or the thickness of the material are simulated. The result is a second data set describing how the light beams entering the material are reflected and transmitted. Due to the complexity of the model, this simulation cannot be performed in real time.

In a fifth step 150, a second ROM is generated based on the second data set. The second ROM is used to describe a reflection and a transmission of a light beam incident into the material. The reflection is described by a function, which describes a reflection intensity of the light beam via an angle of incidence of the light beam relative to the exit boundary surface of the material. The exit boundary layer can have an orientation different from the input boundary layer. In particular, this function can distinguish between horizontal polarization of the light beam and/or vertical polarization of the light beam, so that both reflection intensities can be imaged over the angle of incidence. The transmission is imaged analogously by a second function for the second ROM. The second ROM can have functions for different material thicknesses and different orientations of the exit boundary layer.

After both the reflection and transmission at the entrance boundary layer and within the material are described by ROMs, an overall model for the reflection and transmission of light beams of different angles of incidence and for different thicknesses of a given material is obtained, whereby the entrance boundary layer and the exit boundary layer can be parallel to each other or can be oriented at any other angle to each other. This overall model is provided by method step 160. The two reduced-order models allow the scattering behavior of a light beam to be determined situation-specifically without having to calculate the individual equations, e.g. the Fresnel equations and/or Maxwell equations. This would require more computing capacity or take so long that a simulation in real time is not possible. By the functions of the models the physically exact descriptions of the occurring reflections and transmissions are described in a complexity-reduced way, so that an execution of the method in real time is possible.

By applying the two reduced-order models within method step 170, a bidirectional transmission distribution function (BTDF) and a bidirectional reflection distribution function (BRDF) can be determined for a material, in particular a material of a given thickness.

In step 180, the transport equations for one or more light beams are solved on the basis of the determined BTDF and/or the determined BRDF. The transport equations can be formulated on the basis of the Maxwell equations. The transport equations can be solved analytically and/or numerically. Additionally or alternatively the transport equations can be solved based on a Monte Carlo beam tracing algorithm. Additionally or alternatively the simulation can be based on a finite element method. As a result, luminous intensity distributions, brightness, illuminance distribution, which are necessary for a visual simulation, i.e. an image synthesis, can be determined in step 190. For example, such an image synthesis can comprise an image or an image stream that results when a driver of a vehicle approaches a wall of fog. This can be simulated advantageously in real time with the described solution, in particular if different types of fog are covered by the vehicle's environment.

Figure 2A:
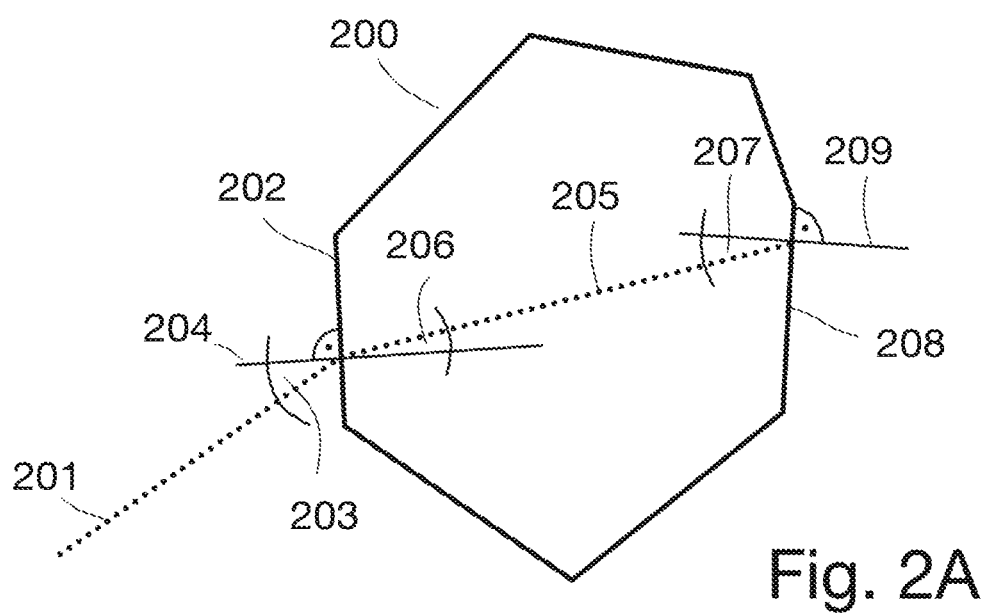
FIG. 2A shows an illustration of the input and output boundary layer in two dimensions on a material.

FIG. 2A first illustrates the reflection and transmission of an incident light beam at an input and output boundary layer of a material 200. It is shown how a light beam 201 enters the material 200 and penetrates it until it exits the material. The light beam 201 enters the material at the input boundary layer 202. The entrance angle 203 is dimensioned relative to the perpendicular 204 of the entrance boundary layer. Due to the refractive properties, i.e. the reflection and transmission properties of the material 200, part of the beam 201 is deflected and passes through the material as a transmitted beam 205. The transmitted beam 205 traverses the distance between the input boundary layer 202 and an output boundary layer 208. The refraction of the beam at the input boundary layer can be described by the angle 206, which is also dimensioned relative to the perpendicular 204 of the input boundary layer 202. The input and output boundary layers are not plane-parallel. As a result, the angle 207 between the vertical 209 of the output boundary surface 208 and the angle 206 is different.

According to an embodiment of the disclosure, the material can be simulated for different thicknesses, wherein the thicknesses represent the distances 205 travelled by a beam in the material. For each area of the material 200, i.e. for each possible input boundary 202 and output boundary 208, a function can now be created which, for different angles of incidence and intensities of the incident light beam, represents resulting angles and/or intensities for reflected and/or transmitted beams. Furthermore, these functions are set up for different materials. This results in a first and/or a second ROM. The first ROM describes reflections and transmissions when the light beam is incident over the input boundary layer. The second ROM describes reflections and transmissions of the light beam within the material relative to the output boundary layer. On the basis of the parameters of the incident beam 201, e.g. the angle of incidence 203 and/or on the basis of the material thickness 205, a corresponding distribution function (e.g. BSDF, BTDF or BRDF) can be performed to simulate a propagation, i.e. the reflection and transmission, of one or more beams. Based on these distribution functions, the transport equations of a visual simulation can be solved.

Figure 2B:
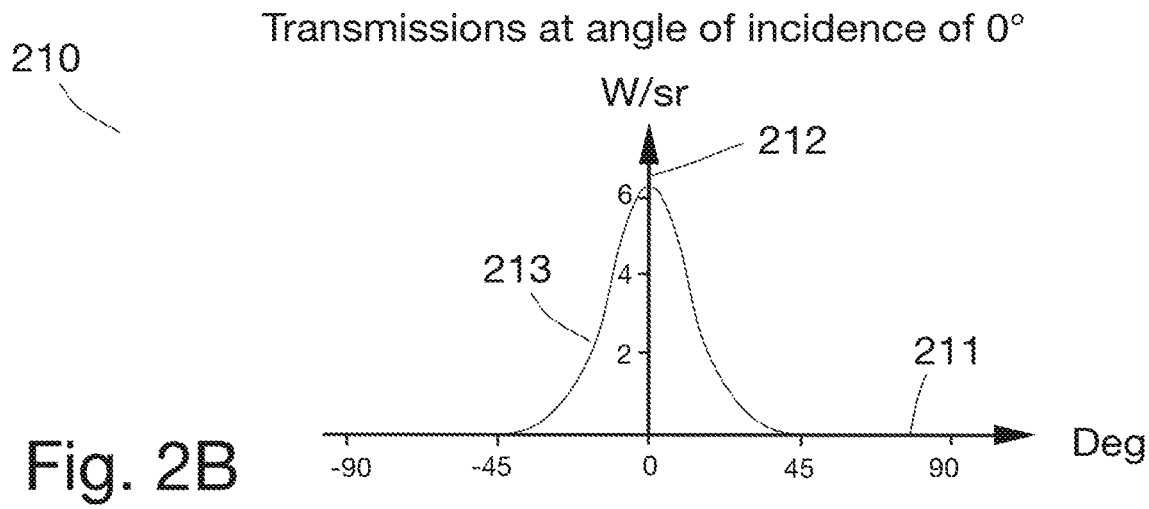
FIGS. 2B, 2C show a function of a beam intensity of different transmission angles for a given angle of incidence.
Figure 2C:
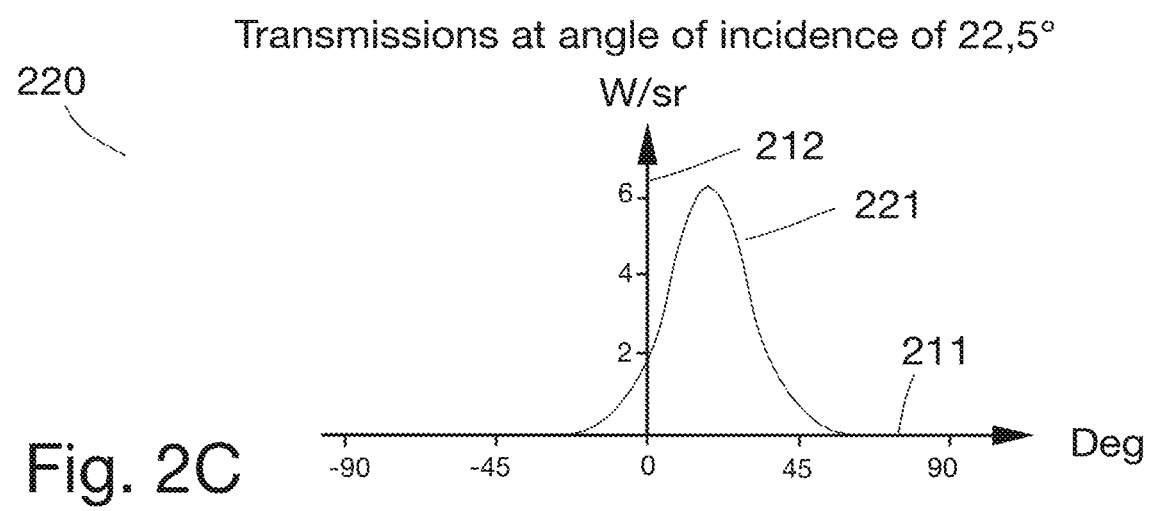

FIGS. 2B and 2C each show a function of beams intensity as a function of different transmission angles for a given angle of incidence. The figures show only the transmission angles in three-dimensional space at an azimuth angle of the spherical coordinates of $\phi=0°$. FIG. 2B shows the transmission of a beam at an angle of incidence of 0°. FIG. 2C shows the transmissions of a beam at an angle of incidence of 22.5°. The abscissa 211 shows all different transmission angles that a refracted beam can have with respect to a boundary layer 202, 208. For a given angle of incidence, which is 0° in FIG. 2B and 22.5° in FIG. 2C, 212 beams intensities are plotted on the ordinate. The beams intensity distribution of transmitted beams for a beam incident at an angle of 0° is shown by curve 213. The beams intensity distribution of transmitted beams for a beam incident at an angle of 22.5° is shown by curve 221. These curves can be represented as look-up tables or as parametric functions, for example by a polynomial, which approximates the curve in the considered range of possible angles on the abscissa. Additionally or alternatively, such a curve can also be approximated by an artificial intelligence algorithm, for example based on a neural network and/or a deep learning algorithm.

Figure 2D:
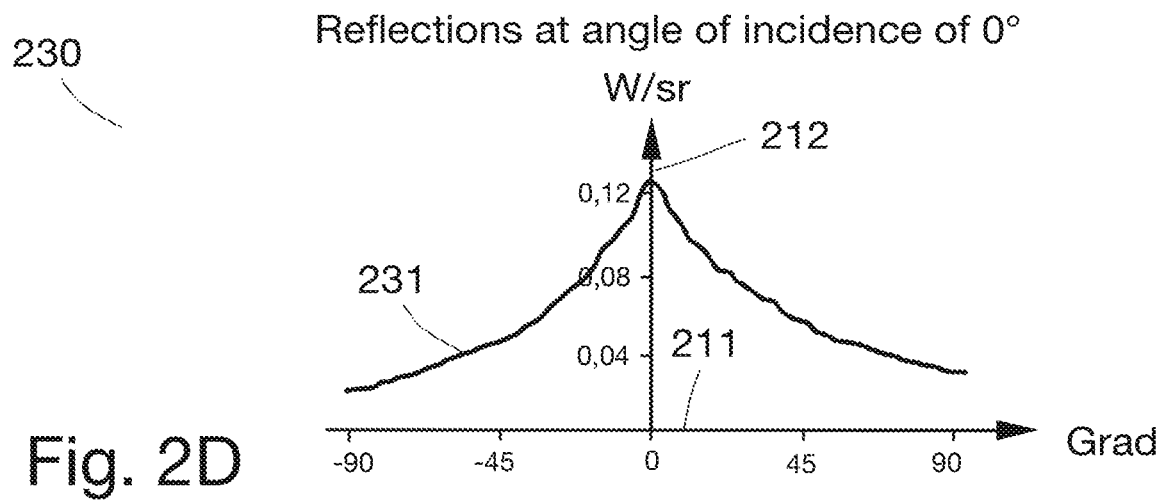
FIGS. 2D, 2E show a function of a beam intensity of different angles of reflection for a given angle of incidence.
Figure 2E:
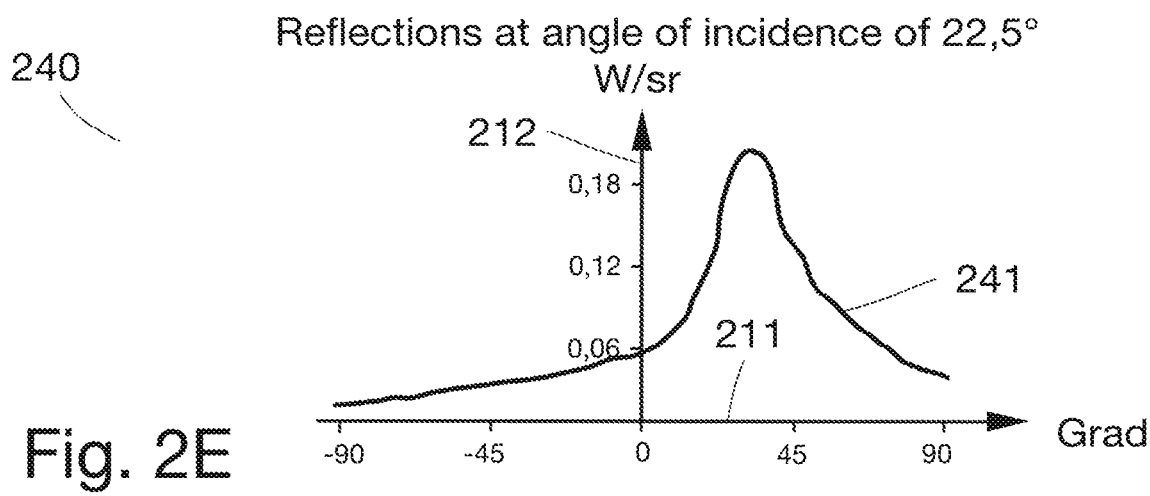

FIGS. 2D and 2E, analogous to the previous two figures, each show a function of beams intensity as a function of different angles of reflection for a given angle of incidence. These curves are also valid for an azimuth angle of $\phi=0°$. Curve 231 shows a beams intensity distribution of reflected beams for an angle of incidence of 0°. Curve 241 shows a beams intensity distribution for an angle of incidence of 22.5°. These curves can also be approximated by a look-up table, by a parametric function and/or by an artificial intelligence algorithm.

Another embodiment that is not shown consists of a method that uses a look-up table as first and/or second ROM. In the look-up table(s), reflection and transmission parameters are stored for different parameters of an incident light beam, e.g. different angles of incidence. The reflection and transmission parameters are dependent on different possible material thicknesses, so that reflection and transmission parameters can be selected depending on the thickness of the material through which the simulated beam penetrates. Additionally or alternatively, the reflection and transmission parameters can be determined for different inclinations of the entrance boundary layer and the exit boundary layer to each other. Thus, the two boundary layers need not be plane-parallel.

Figure 3:
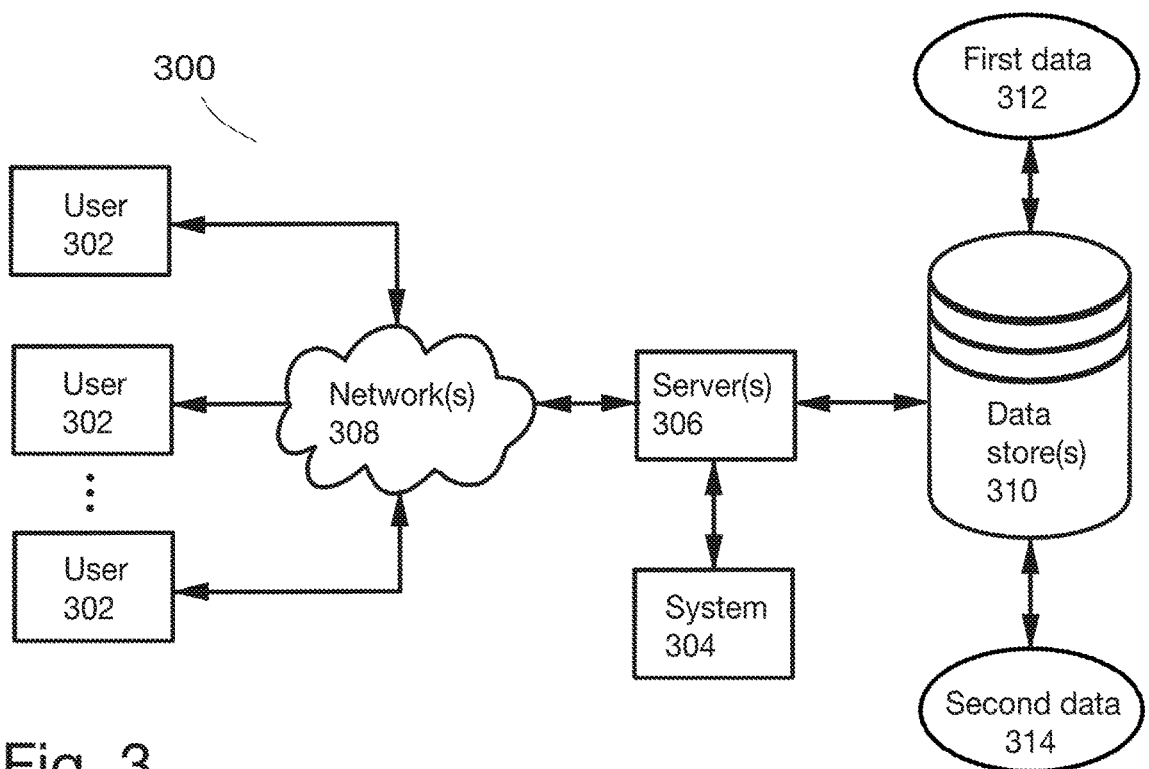
FIG. 3 shows a block diagram illustrating an example computer-implemented environment according to an embodiment of disclosure.

FIG. 3 depicts a computer-implemented environment 300 wherein users 302 can interact with a system 304 hosted on one or more servers 306 through a network 308. The system 304 contains software operations or routines. The users 302 can interact with the system 304 through a number of ways, such as over one or more networks 308. One or more servers 306 accessible through the network(s) 308 can host system 304. The processing system 304 has access to a non-transitory computer-readable memory in addition to one or more data stores 310. The one or more data stores 310 may contain first data 312 as well as second data 314. It should be understood that the system 304 could also be provided on a stand-alone computer for access by a user.

Figure 4A:
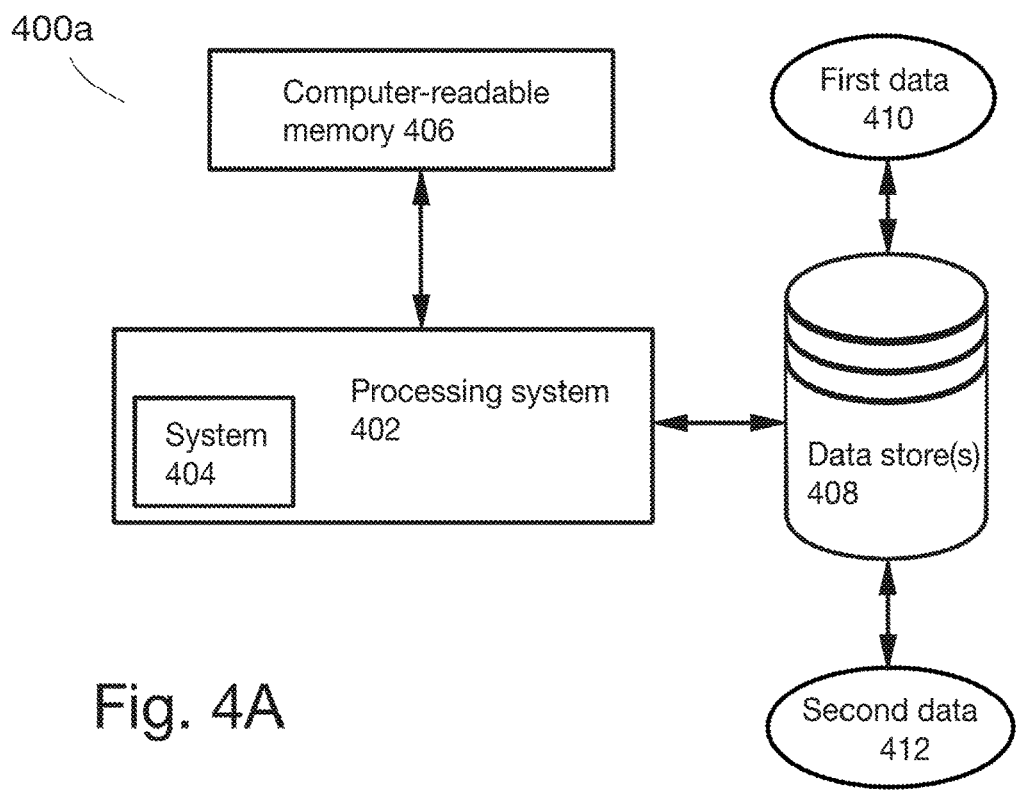
FIG. 4A shows a block diagram illustrating an exemplary system that includes an independent computer architecture according to an embodiment of disclosure.
Figure 4B:
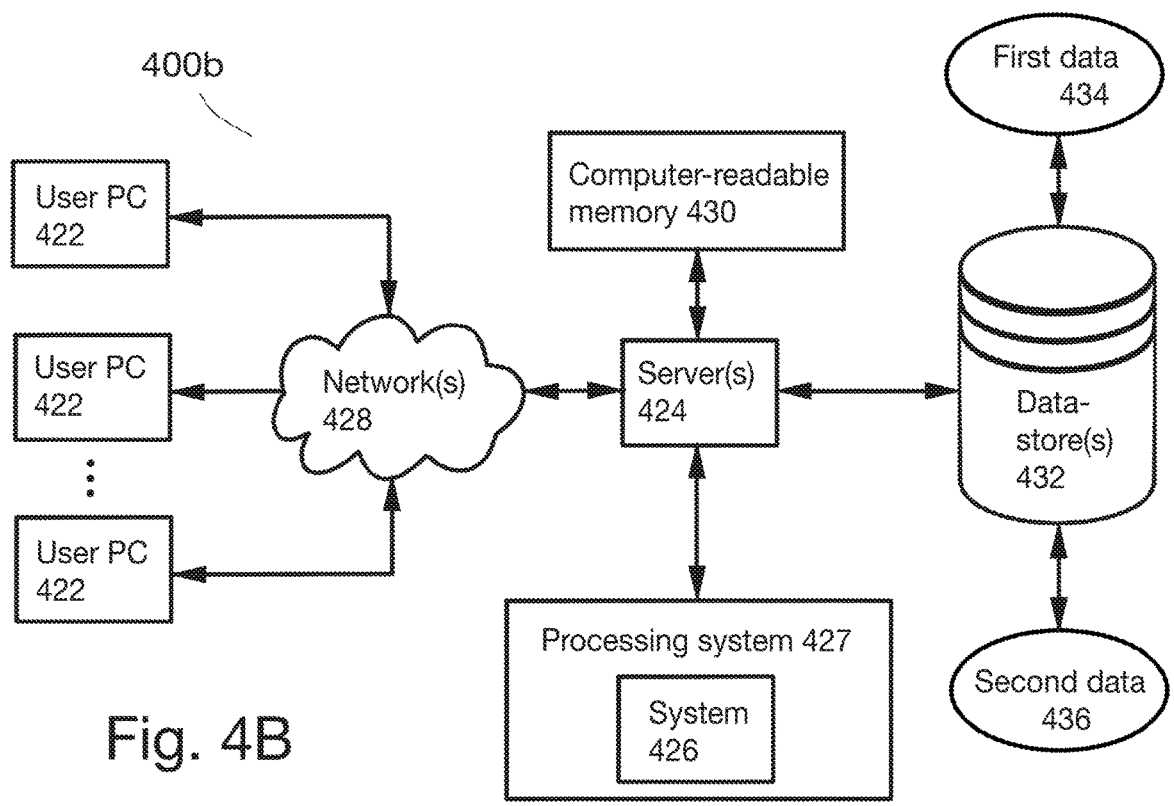
FIG. 4B shows a block diagram illustrating an exemplary system that includes a client-server architecture according to an embodiment of the disclosure.
Figure 4C:
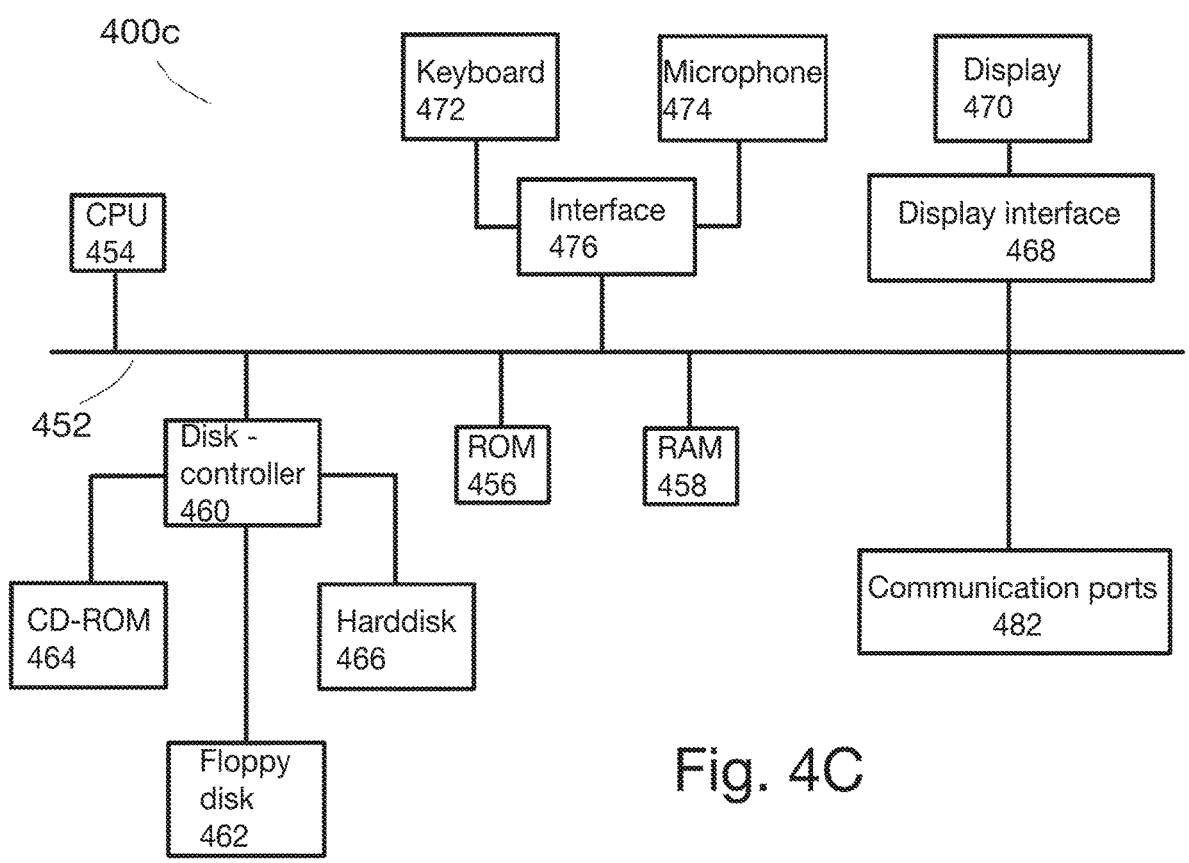
FIG. 4C shows a block diagram showing exemplary hardware for a stand-alone computer architecture that can be used to implement one or more of the embodiments described herein.

FIGS. 4A, 4B and 4C depict example systems for use in implementing a system. For example, FIG. 4A depicts an exemplary system 400a that includes a standalone computer architecture where a processing system 402 (e.g., one or more computer processors) includes a system 404 being executed on it. The processing system 402 has access to a non-transitory computer-readable memory 406 in addition to one or more data stores 408. The one or more data stores 408 may contain first data 410 as well as second data 412.

FIG. 4B depicts a system 400b that includes a client server architecture. One or more user PCs 422 can access one or more servers 424 running a system 426 on a processing system 427 via one or more networks 428. The one or more servers 424 may access a non-transitory computer readable memory 430 as well as one or more data stores 432. The one or more data stores 432 may contain first data 434 as well as second data 436.

FIG. 4C shows a block diagram of exemplary hardware for a standalone computer architecture 400c, such as the architecture depicted in FIG. 4A, that may be used to contain and/or implement the program instructions of system embodiments of the present disclosure. A bus 452 may serve as the information highway interconnecting the other illustrated components of the hardware. A processing system 454 labeled CPU (central processing unit) (e.g., one or more computer processors), may perform calculations and logic operations required to execute a program. A non-transitory computer-readable storage medium, such as read only memory (ROM) 456 and random-access memory (RAM) 458, may be in communication with the processing system 254 and may contain one or more programming instructions. Optionally, program instructions may be stored on a non-transitory computer-readable storage medium such as a magnetic disk, optical disk, recordable memory device, flash memory, or other physical storage medium. Computer instructions may also be communicated via a communications signal, or a modulated carrier wave, e.g., such that the instructions may then be stored on a non-transitory computer-readable storage medium.

A disk controller 460 boundary layers one or more optional disk drives to the system bus 452. These disk drives may be external or internal floppy disk drives such as 462, external or internal CD-ROM, CD-R, CD-RW or DVD drives such as 464, or external or internal hard drives 466. As indicated previously, these various disk drives and disk controllers are optional devices.

Each of the element managers, real-time data buffer, conveyors, file input processor, database index shared access memory loader, reference data buffer and data managers may include a software application stored in one or more of the disk drives connected to the disk controller 460, the ROM 456 and/or the RAM 458. Preferably, the processor 454 may access each component as required.

A display boundary layer 468 may permit information from the bus 456 to be displayed on a display 470 in audio, graphic, or alphanumeric format. Communication with external devices may optionally occur using various communication ports 482.

In addition to the standard computer-type components, the hardware may also include data input devices, such as a keyboard 472, or other input device 474, such as a microphone, remote control, pointer, mouse, touchscreen and/or joystick. These input devices can be coupled to bus 452 via boundary layer 476.

REFERENCE CHARACTER LIST

100 Method according to an embodiment of disclosure
110-190 Method steps
201 the beam is incident
202 first boundary layer
203 Angle
204 Normal on the first boundary layer
205 free path length of the refracted beam
206 Angle of the refracted beam
207 Angle of the refracted beam on the second boundary layer
208 second boundary layer
209 Normal to the second boundary layer
210-240 Function of angles of incidence on beams intensities
211 Abscissa
212 ordinate
213 Curve of function 210
221 Curve of function 220
231 Curve of function 230
241 Curve of the function 240
300 Computer environment
302 User
304 System
306 Server
308 Network
310 Data memory
312 first date
314 second date
400a System
402 Processing system
404 System
406 Computer-readable memory
408 Data memory
410 first date
412 second date

What is claimed is:

1. A non-transitory machine readable medium storing executable program instructions which when executed by a data processing system cause the data processing system to perform a method comprising:

providing a representation of a light beam including transmitting towards a diffusive material, the light beam incident on a first boundary layer of the diffusive material, and propagating through the diffusive material towards a second boundary layer of the diffusive material;

invoking a first model to assign one or more reflection and/or transmission parameters for the light beam incident on the first boundary layer based on the diffusive material, wherein the one or more reflection and/or transmission parameters for the light beam incident on the first boundary layer are assigned according to parametric function mapping of an incident angle of the light beam at the first boundary layer;

invoking a second model to assign one or more reflection and/or transmission parameters for the propagating towards the second boundary layer based on the diffusive material, the one or more reflection and/or transmission parameters for the propagating assigned according to parametric function mapping of incident angles of the propagation at the second boundary layer;

determining a bidirectional transmission distribution function (BTDF) and a bidirectional reflection distribution function (BRDF) based on the first model and the second model invoked for the diffusive material; and simulating transmission and reflection of the light beam propagating through the diffusive material based on the determined BTDF and BRDF.

2. The medium of claim 1, wherein the diffusive material has a thickness and wherein the one or more reflection and/or the transmission parameters for the propagating are determined based on the thickness of the diffusive material.

3. The medium of claim 2, wherein the thickness of the diffusive material is determined by a free path length of the light beam in the diffusive material.

4. The medium as in claim 1, wherein the one or more reflection and/or a transmission parameters for the light beam incident on the first boundary layer are determined based on wave-dependent parameters associated with the diffusive material and wherein the wave-dependent parameters include absorption coefficient, diffusion coefficient, phase function, or refractive index.

5. The medium as in claim 1, wherein the second model is configured to map one or more parameters of the light beam propagating towards the second boundary layer to the one or more reflection and/or transmission parameters of the diffusive material.

6. The medium as in claim 1, wherein the first model or the second model include a function based on a part of a power series of an analytical function and/or a statistical function.

7. The non-transitory machine readable medium of claim 1, wherein the first model comprises a first parametric function mapping a first transmission intensity of the light beam to a first range of transmission angles for a first set of incident angles of the light beam at the first boundary layer and wherein the second model comprises a second parametric function mapping a second transmission intensity of the light beam to a second range of transmission angles for a second set of incident angles of the light beam at the second boundary layer.

8. A computer implemented method for simulating an electromagnetic beam, the method comprising:
    simulating transmission and reflection of a light beam entering a diffusive material, the light beam incident on an entrance boundary of the diffusive material and propagating through the diffusive material towards an exit boundary of the diffusive material; and
    generating, based on the simulation of the light beam, a first reduced order model describing transmission and reflection for the light beam entering the diffusive material as functions of a thickness of the diffusive material and an incident angle of the light beam entering the diffusive material, wherein the first reduced order model is configured to assign one or more reflection and/or transmission parameters for the light beam incident on the entrance boundary based on the diffusive material, the one or more reflection and/or transmission parameters for the light beam incident on the entrance boundary are assigned according to parametric function mapping of the incident angle of the light beam at the entrance boundary of the diffusive material;
    generating, based on the simulation of the light beam, a second reduced order model describing the transmission and reflection for the light beam exiting the diffusive material as functions of the thickness of the diffusive material and an incident angle of the light beam exiting the diffusive material, wherein the second reduced order model is configured to assign one or more reflection and/or transmission parameters for the propagating towards the exit boundary based on the diffusive material, the one or more reflection and/or transmission parameters for the propagating assigned according to parametric function mapping of incident angles of the propagation at the exit boundary of the diffusive material;
    determining a bidirectional transmission distribution function (BTDF) and a bidirectional reflection distribution function (BRDF) based on the first reduced order model and the second reduced order model invoked for the diffusive material; and
    simulating transmission and reflection of the light beam propagating through the diffusive material based on the determined BTDF and BRDF.

9. The method as in claim 8, wherein the light beam enters the diffusive material via the entrance boundary of the diffusive material, wherein the light beam exits the diffusive material via the exit boundary of the diffusive material, and wherein the thickness of the diffusive material corresponds to a distance between the entrance boundary and the exit boundary.

10. The method of claim 9, wherein the distance is determined based on a free path length between the entrance boundary and the exit boundary.

11. The computer implemented method of claim 8, wherein the first reduced order model comprises a first parametric function mapping a first transmission intensity of the light beam to a first range of transmission angles for a first set of incident angles of the light beam at the entrance boundary of the diffusive material and wherein the second reduced order model comprises a second parametric function mapping a second transmission intensity of the light beam to a second range of transmission angles for a second set of incident angles of the light beam at the exit boundary of the diffusive material.

12. A non-transitory machine readable medium storing executable program instructions which when executed by a data processing system cause the data processing system to perform a method comprising:
    simulating transmission and reflection of a light beam incident on an entrance boundary of a diffusive material and propagating through the diffusive material towards an exit boundary of the diffusive material;
    providing a first reduced order model describing transmission and reflection for the light beam entering the diffusive material as functions of a thickness of the diffusive material and an incident angle of the light beam entering the diffusive material, wherein the first reduced order model is configured to assign one or more reflection and/or transmission parameters for the light beam incident on the entrance boundary based on the diffusive material, the one or more reflection and/or transmission parameters for the light beam incident on the entrance boundary are assigned according to parametric function mapping of the incident angle of light beam at the entrance boundary of the diffusive material;
    providing a second reduced order model describing transmission and reflection for the light beam exiting the diffusive material as functions of the thickness of the diffusive material and an incident angle of the light beam exiting the diffusive material, wherein the second reduced order model is configured to assign one or more reflection and/or transmission parameters for the propagating towards the exit boundary based on the diffusive material, the one or more reflection and/or transmission parameters for the propagating assigned according to parametric function mapping of incident angles of the propagation at the exit boundary of the diffusive material;

determining a bidirectional transmission distribution function (BTDF) and a bidirectional reflection distribution function (BRDF) based on the first reduced order model and the second reduced order model invoked for the diffusive material; and simulating transmission and reflection of the light beam propagating through the diffusive material based on the determined BTDF and BRDF.

13. The medium of claim 12, wherein the simulation comprises:

invoking the first reduced order model based on the incident angle of the light beam on the entrance boundary and the thickness of the diffusive material between the entrance boundary and the exit boundary.

14. The medium of claim 13, wherein the simulation further comprises:

invoking the second reduced order model based on the incident angle of the light beam on the exit boundary and the thickness of the diffusive material.

15. The medium of claim 13, wherein the simulation further comprises: determining a free path length between the entrance boundary and the exit boundary, wherein the thickness of the diffusive material corresponds to the free path length.

16. The medium of claim 12, wherein the simulation comprises:

generating effects of the transmission and reflection of the light beam based on the BTDF and the BRDF.

17. The medium as in claim 16, wherein the BTDF and the BRDF are determined according to the thickness of the diffusive material between the entrance boundary and the exit boundary.

18. The non-transitory machine readable medium of claim 12, wherein the first reduced order model comprises a first parametric function mapping a first transmission intensity of the light beam to a first range of transmission angles for a first set of incident angles of the light beam at the entrance boundary of the diffusive material and wherein the second reduced order model comprises a second parametric function mapping a second transmission intensity of the light beam to a second range of transmission angles for a second set of incident angles of the light beam at the exit boundary of the diffusive material.

19. A system, comprising
a memory storing instructions;
one or more processors coupled to the memory, the one or more processors executing the instructions from the memory, the one or more processors configured to perform a method comprising:

providing a representation of a light beam transmitting towards a diffusive material, the light beam incident on a first boundary layer of the diffusive material, and propagating through the diffusive material towards a second boundary layer of the diffusive material;

invoking a first model to assign one or more reflection and/or transmission parameters for the light beam incident on the first boundary layer based on the diffusive material, wherein the one or more reflection and/or transmission parameters for the light beam incident on an entrance boundary are assigned according to parametric function mapping of an incident angle of the light beam at the first boundary layer;

invoking a second model to assign one or more reflection and/or transmission parameters for the propagating towards the second boundary layer based on the diffusive material, the one or more reflection and/or transmission parameters for the propagating assigned according to parametric function mapping of incident angles of the propagation at the second boundary layer;

determining a bidirectional transmission distribution function (BTDF) and a bidirectional reflection distribution function (BRDF) based on the first model and the second model invoked for the diffusive material; and simulating transmission and reflection of the light beam propagating through the diffusive material based on the determined BTDF and BRDF.

20. The system of claim 19, wherein the first model comprises a first parametric function mapping a first transmission intensity of the light beam to a first range of transmission angles for a first set of incident angles of the light beam at the first boundary layer and wherein the second model comprises a second parametric function mapping a second transmission intensity of the light beam to a second range of transmission angles for a second set of incident angles of the light beam at the second boundary layer.

* * * * *